(12) United States Patent
Ren et al.

(10) Patent No.: US 10,816,589 B2
(45) Date of Patent: Oct. 27, 2020

(54) STRUCTURE AND METHOD FOR TESTING SEMICONDUCTOR DEVICE

(71) Applicant: CSMC TECHNOLOGIES FAB2 CO., LTD., Wuxi New District, Jiangsu (CN)

(72) Inventors: Xiaobing Ren, Jiangsu (CN); Qun Liu, Jiangsu (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 16/474,943

(22) PCT Filed: Dec. 26, 2017

(86) PCT No.: PCT/CN2017/118584
§ 371 (c)(1),
(2) Date: Jun. 28, 2019

(87) PCT Pub. No.: WO2018/121521
PCT Pub. Date: Jul. 5, 2018

(65) Prior Publication Data
US 2019/0346500 A1 Nov. 14, 2019

(30) Foreign Application Priority Data
Dec. 28, 2016 (CN) .......................... 2016 1 1234296

(51) Int. Cl.
*G01R 31/02* (2006.01)
*G01R 31/26* (2020.01)
*H01L 23/544* (2006.01)

(52) U.S. Cl.
CPC ..... *G01R 31/2607* (2013.01); *G01R 31/2648* (2013.01); *H01L 23/544* (2013.01)

(58) Field of Classification Search
CPC ............ G01R 31/2607; G01R 31/2648; G01R 31/025; G01R 31/021; G01R 31/08; G01R 31/083; G01R 27/205
See application file for complete search history.

(56) References Cited

U.S. PATENT DOCUMENTS

2002/0017906 A1 2/2002 Ho et al.
2006/0141730 A1* 6/2006 Grossi ................ H01L 27/0802
438/382

(Continued)

FOREIGN PATENT DOCUMENTS

CN 103872021 6/2014
CN 105514088 4/2016

OTHER PUBLICATIONS

International Search Report issued for International Patent Application No. PCT/CN2017/118584, dated Mar. 28, 2018, 5 pages including English translation.

*Primary Examiner* — Thang X Le
(74) *Attorney, Agent, or Firm* — Hamre, Schumann, Mueller & Larson, P.C.

(57) ABSTRACT

A structure for testing a semiconductor device. A first resistor structure (R1) comprises a first active region (110) and a first polysilicon gate (130) disposed on the first active region (110); the width of the first active region (110) is greater than a predetermined width value; the predetermined width value is the critical value of the width of an active region of the semiconductor device when the step height of a shallow trench isolation structure of the semiconductor device affects the width of a polysilicon gate; the design width of the first polysilicon gate (130) is identical to that of the polysilicon gate of the semiconductor device; a second resistor structure (R2) is connected to the first resistor structure (R1) according to a predetermined circuit structure to form a test circuit, and comprises a second active region (Continued)

(210) and a second polysilicon gate (230) disposed on the second active region (210); the width of the second active region (210) is less than the predetermined width value; the design size of the second polysilicon gate (230) is identical to that of the first polysilicon gate (130); the total resistance of a branch circuit where the second resistor structure (R2) is located is equal to the total resistance of a branch circuit where the first resistor structure (R1) is located.

19 Claims, 5 Drawing Sheets

(56) References Cited

U.S. PATENT DOCUMENTS

| 2008/0272371 A1* | 11/2008 | Li ............................ | H01L 22/34 |
| | | | 257/48 |
| 2014/0070829 A1* | 3/2014 | Fornara ................... | H01L 22/34 |
| | | | 324/750.3 |
| 2020/0219574 A1* | 7/2020 | Chung .................... | G11C 17/16 |

* cited by examiner

STRUCTURE AND METHOD FOR TESTING SEMICONDUCTOR DEVICE

TECHNICAL FIELD

The present disclosure relates to a field of semiconductor testing technology, and more particularly, to a test structure and a test method for a semiconductor device.

BACKGROUND

A semiconductor device includes a shallow trench isolation structure, a polysilicon gate, and an active region. As a dimension of the semiconductor device such as an MOS (Metal-Oxide-Semiconductor) transistor is reduced, a dimension of the polysilicon gate of the semiconductor device has a large influence on parameters of a short-channel device. In the PCM (Process Control Monitor) test, a test structure is required to monitor a width of the polysilicon gate. The conventional test structure is a structure of a comb-shaped MOS capacitor, and the polysilicon gate of this structure does not vary in accordance with a variation of a step height of the STI (Shallow Trench Isolation) structure. However, an actual situation is that the width of the poly silicon gate of the small dimension active region varies with the step height of the STI. Therefore, this test structure cannot monitor an influence of step height of the STI on the width of the polysilicon gate on the active region.

SUMMARY

Based on the above, it is necessary to provide a test structure and a test method for a semiconductor device.

A test structure for a semiconductor device is provided, including: a first resistor structure including a first active region and a first polysilicon gate disposed on the first active region, a width of the first active region being greater than a predetermined width value, the predetermined width value being a critical value of a width of an active region of the semiconductor device when a step height of a shallow trench isolation structure of the semiconductor device has an influence on a width of a polysilicon gate of the semiconductor device, and a design width of the first polysilicon gate being equal to a design width of the polysilicon gate of the semiconductor device; and a second resistor structure electrically connected to the first resistor structure in a predetermined circuit structure so as to form a test circuit, the second resistor structure including a second active region and a second polysilicon gate disposed on the second active region, a width of the second active region being less than the predetermined width value, a design dimension of the second polysilicon gate being equal to a design dimension of the first polysilicon gate, and a total resistance of a branch in which the second resistor structure is located being equal to a total resistance of a branch in which the first resistor structure is located.

A test method based on a test structure for a semiconductor device is also provided. The test structure includes: a first resistor structure including a first active region and a first polysilicon gate disposed on the first active region, a width of the first active region being greater than a predetermined width value, the predetermined width value being a critical value of a width of an active region of the semiconductor device when a step height of a shallow trench isolation structure of the semiconductor device has an influence on a width of a polysilicon gate of the semiconductor device, and a design width of the first polysilicon gate being equal to a design width of the polysilicon gate of the semiconductor device; and a second resistor structure electrically connected to the first resistor structure in a predetermined circuit structure so as to form a test circuit, the second resistor structure including a second active region and a second polysilicon gate disposed on the second active region, a width of the second active region being less than the predetermined width value, a design dimension of the second polysilicon gate being equal to a design dimension of the first polysilicon gate, and a total resistance of a branch in which the second resistor structure is located being equal to a total resistance of a branch in which the first resistor structure is located.

The test method includes:

applying a voltage to the test circuit to cause the test circuit to operate;

measuring a voltage difference between the first resistor structure and the second resistor structure; and monitoring the influence of the step height of the shallow trench isolation structure of the semiconductor device on the width of the polysilicon gate according to a variation of the voltage difference.

Details of one or more embodiments of the present disclosure are set forth in the accompanying drawings and description below. Other features, objects, and advantages of the present disclosure will be apparent from the description and appended claims.

BRIEF DESCRIPTION OF THE DRAWINGS

The above and other objects, features and advantages of the disclosure will become more apparent from a more specific description of the preferred embodiments of the disclosure shown in the accompanying drawings. Same reference numerals refer to same parts throughout the drawings and are not intended to scale equally to the actual dimensions, focusing on illustrating the spirit of the disclosure.

DETAILED DESCRIPTION OF THE EMBODIMENTS

Figure 1:
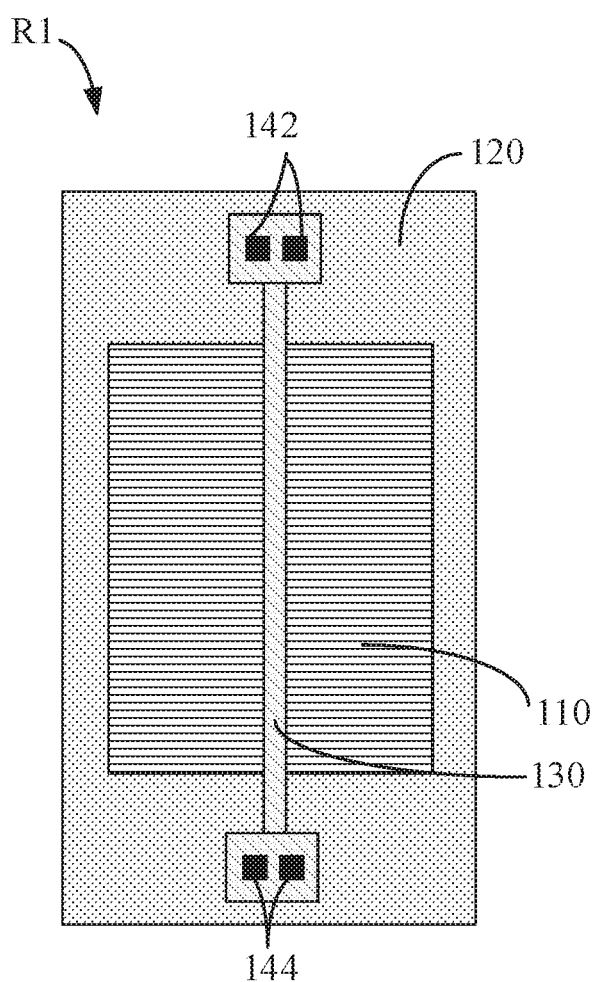
FIG. 1 is a structural schematic diagram of a first resistor structure according to an embodiment.

In order to facilitate the understanding of the present disclosure, the present disclosure will be described more fully hereinafter with reference to the accompanying drawings. Preferred embodiments of the invention are given in the drawings. However, the disclosure may be embodied in many different forms and is not limited to the embodiments described herein. Rather, these embodiments are provided so that this disclosure will be thorough and comprehensive.

All technical and scientific terms used herein have the same meaning as commonly understood by one of ordinary skill in the art to which this invention belongs, unless otherwise defined. The terminology used in the description of the present disclosure is for the purpose of describing particular embodiments and is not intended to limit the invention. The term "and/or" used herein includes any and all combinations of one or more of the associated listed items.

It should be noted that when an element is referred to as being "fixed" to another element, it can be directly on another element or an intermediate element can be present. When an element is considered to be "connected" to another element, it can be directly connected to another element or an intermediate element can be present. The terms "vertical", "horizontal", "upper", "lower", "left", "right" and the like, as used herein, are used for purposes of illustration only.

A test structure for a semiconductor device according to an embodiment is used to monitor an influence of a step height of a shallow trench isolation structure of the semiconductor device on a width of the polysilicon gate, so that a thickness of the photoresist for photoetching the polysilicon can be adjusted according to a degree of the influence, to reduce the influence of the step height of the shallow trench isolation structure on the width of the polysilicon gate, and ensure that a feature dimension of a manufactured final semiconductor device is a target feature dimension. The test structure of the semiconductor device (hereinafter referred to as the test structure) is disposed in a scribe line region of a silicon wafer. In this embodiment, the test structure includes a first resistor structure R1 and a second resistor structure R2 that are independent of each other.

A structure of the first resistor structure R1 is shown in FIG. 1. The first resistor structure R1 includes a first active region 110, a first field region 120, a first polysilicon gate 130, contact holes 142 and contact holes 144. N-typed or P-typed ion implantation is performed in the first active region 110. The N-typed or P-typed ion implantation in the first active region 110 is achieved by a non-self-alignment process (Non Salicide), and thus the first resistor structure R1 is an N-typed or P-typed non-self-aligned silicide (Non Salicide) resistor. A width of the N-typed or P-typed implanted region is adapted to a width of the first active region 110. The first field region 120 may be disposed to surround the first active region 110. The first polysilicon gate 130 is disposed on the first active region 110. The contact holes 142 and the contact holes 144 may be disposed on the first field region 120 and located at both ends of the first polysilicon gate 130, specifically at both ends of the first polysilicon gate 130 in a length direction.

Figure 2:
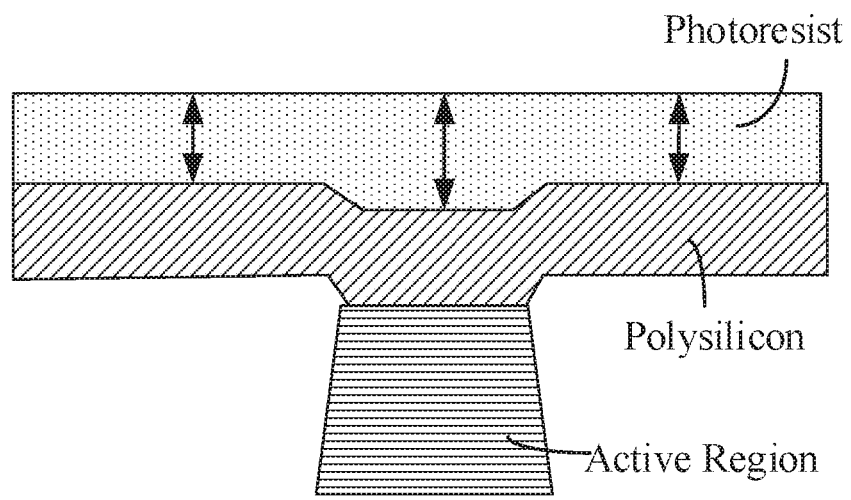
FIG. 2 is a schematic diagram showing photoresist step coverage when photoetching polysilicon in a small dimension active region.
Figure 3:
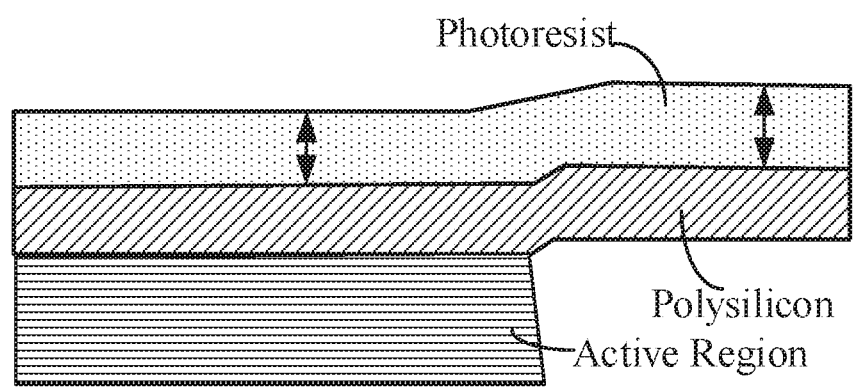
FIG. 3 is a schematic diagram showing photoresist step coverage when photoetching polysilicon in a large dimension active region.
Figure 4:
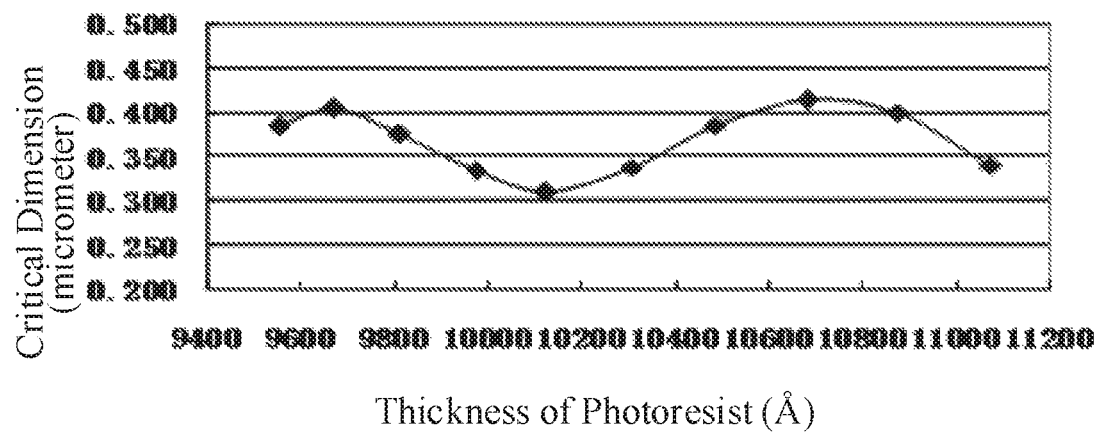
FIG. 4 is a curve diagram showing a relationship between a thickness of photoresist and a width of a polysilicon gate.

The width of the first active region 110 needs to be greater than a predetermined width value. The predetermined width value is a critical value of a width of an active region of the semiconductor device when a step height of a shallow trench isolation structure of the semiconductor device has an influence on a width of a polysilicon gate of the semiconductor device. In this embodiment, an active region having a width larger than the predetermined width value is defined as a large dimension active region, and an active region having a width smaller than a predetermined width value is defined as a small dimension active region. The step height of the shallow trench isolation structure results in the polysilicon deposited on an interface between the active region and the shallow trench isolation structure forming a step. Due to a step coverage characteristic of the photoresist, as shown in FIG. 2, a thickness of the polysilicon photoresist on the independent small dimension active region (that is, the active region having a width smaller than the predetermined width value) is larger than a thickness of the photoresist on the adjacent shallow trench isolation structure. This thickness difference is equal to the step height of the shallow trench isolation structure. In the large dimension active region (that is, the active region having a width greater than the predetermined width value), as shown in FIG. 3, the thickness of the photoresist is equal to the thickness of the photoresist on the shallow trench isolation structure regardless of the step height of the shallow trench isolation structure. A variation of the thickness of the photoresist will lead to a variation of a width of a photoresist strip after lithography, which leads to a variation of a width of a prepared polysilicon gate. FIG. 4 is a curve diagram showing a relationship between the thickness of the photoresist and a critical dimension of the semiconductor device (CD, that is, the width of the polysilicon gate). In FIG. 4, the horizontal axis is the thickness of the photoresist, and the vertical axis is the critical dimension. When the thickness of the photoresist is in a peak or a valley position of the curve, the thickness has less influence on the critical dimension. While in other regions, the critical dimension varies greatly, that is, when the step height of the shallow trench isolation structure fluctuates, since the width of the independent small dimension active region of the polysilicon gate varies, the width of the polysilicon gate varies more when the thickness of the photoresist on the independent small dimension active region is in other regions of the curve. The width of the polysilicon gate of the large active region is not affected.

In an embodiment, the predetermined width value is 3 micrometers. Therefore, the first active region 110 having width greater than 3 micrometers is a large dimension active region, so the width of the first polysilicon gate 130 disposed on the first active region 110 does not vary in accordance with the variation of the step height of the shallow trench isolation structure, that is, an actual width of the first polysilicon gate 130 is equal to a design width. The longer the length of the first active region 110 is, the better, and a minimum value may be 20 micrometers. Specifically, the first active region 110 has a width of 20 micrometers and a length of 60 micrometers.

As shown in FIG. 1, the first polysilicon gate 130 may be disposed at a middle position of the first active region 110, and a length direction of the first polysilicon gate 130 is parallel to a length direction of the first active region 110. A design width of the first polysilicon gate 130 is equal to a design width of the polysilicon gate of the semiconductor device to be monitored, that is, the design width of the first polysilicon gate 130 is the feature dimension of the semiconductor device to be tested. The design width mentioned herein refers to a design parameter for preparing the polysilicon gate. In an embodiment, the first polysilicon gate 130 acts as a resistive strip with its both ends extending out of the first active region 110 and extending into the first field region 120. Further, lengths of portions of both ends of the first polysilicon gate extending out of the first active region are equal. The length of the first polysilicon gate 130 in the first active region 110 is the length of the first active region 110. For example, the length of the first polysilicon gate 130 in the first active region 110 is 60 mm, representing the length of the first active region 110 is 60 micrometers.

Figure 5:
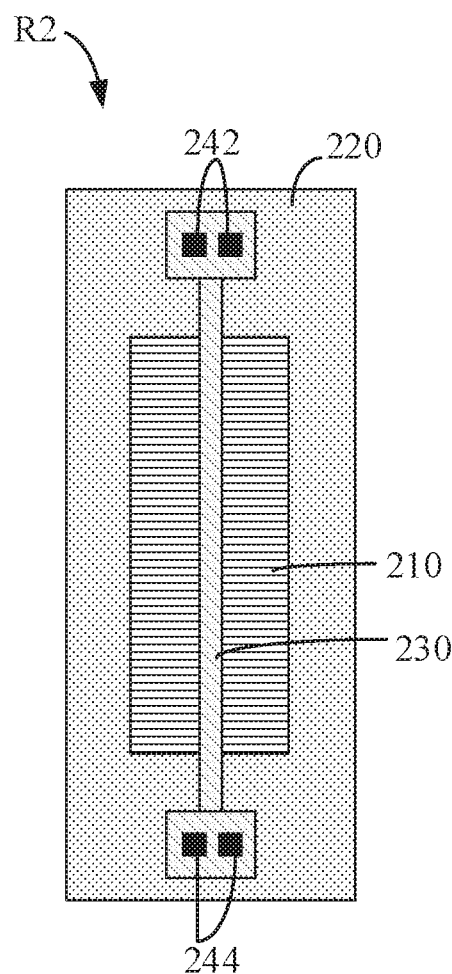
FIG. 5 is a structural schematic diagram of a second resistor structure according to an embodiment.

The contact holes 142 in the first field region 120 and the contact holes 144 in the first field region 120 are used for connection with metal wirings, so as to realize electrical connection of the first resistor structure R1 with other devices. The contact holes 142 and the contact holes 144 may be the same in structure and symmetrically disposed. The structure of the second resistor structure R2 is shown in FIG. 5. The second resistor structure R2 includes a second active region 210, a second field region 220, a second polysilicon gate 230, contact holes 242 and contact holes 244. N-typed or P-typed ion implantation is performed in the second active region 210. The N-typed or P-typed ion implantation in the second active region 210 is achieved by a non-self-aligned process (Non Salicide), and thus the second resistor structure R2 is an N-typed or P-typed non-self-aligned silicide resistor. In this embodiment, the type of ions implanted in the second active region 210 is the same as the type of ions implanted in the first active region 110, and both are N-typed or P-typed ions, thereby making the first active region 110 and the second active region 210 are both N-typed or P-typed non-self-aligned silicide resistors. The thickness uniformity of self-aligning silicide is poor in the small dimension active region, while the thickness has great influence on resistance, thus the influence of the width of the polysilicon gate on the resistance is reduced, which is not conducive to analysis. The problem can be overcome well by using the non-self-aligned silicide resistor. In addition, the non-self-aligning silicide resistor has a relatively high resistance value (such as 260Ω) to facilitate data measurement, while the self-aligning silicide has a relatively low resistance value (such as 5Ω) which is not convenient for measurement. The width of the N-typed or P-typed implanted region is adapted to the width of the second active region 210. The second field region 220 is disposed to surround the second active region 210. The length of the second field region 220 is equal to the length of the first field region 120. The second polysilicon gate 230 is disposed on the second active region 210. The contact holes 242 and the contact holes 244 may be disposed on the second field region 220 and located at both ends of the second polysilicon gate 230, specifically at both ends of the second polysilicon gate 230 in the length direction.

The width of the second active region 210 is less than the predetermined width value, and the predetermined width value may be 3 micrometers. Therefore, the second active region 210 has a width less than 3 micrometers is a small dimension active region. Therefore, the width of the second polysilicon gate 230 disposed on the second active region 210 varies according to the variation of the step height of the shallow trench isolation structure, that is, the actual width and design width of the second polysilicon gate 230 may have some fluctuation. The longer the length of the second active region 210 is, the better, and the minimum may be 20 micrometers. In a specific embodiment, the second active region 210 has a width of 1 micrometer and a length of 60 micrometers.

The second polysilicon gate 230 may be disposed at a middle position of the second active region 210, and the length direction of the second polysilicon gate 230 is parallel to the length direction of the second active region 210. The design dimension of the second polysilicon gate 230 is equal to the design dimension of the first polysilicon gate 130. Specifically the design width of the second polysilicon gate 230 is equal to the design width of the first polysilicon gate 130, and the design length of the second polysilicon gate 230 is equal to the design length of the first polysilicon gate 130. In this way, in addition that the width of the active region and the width of the corresponding N-typed (or P-typed) implantation region are in different width, other factors are the same in the first resistor structure R1 and the second resistor structure R2. In an embodiment, the second polysilicon gate 230 acts as a resistive strip with its ends extending out of the second active region 210 and extending into the second field region 220. Further, lengths of portions of both ends of the second polysilicon gate 230 extending out of the second active region 210 are equal. The length of the second polysilicon gate 230 in the second active region 210 is the length of the second active region 210. For example, the length of the second polysilicon gate 230 in the second active region 210 is 60 micrometers, representing the length of the second active region 110 is 60 micrometers. In an embodiment, the length of the second polysilicon gate 230 extending on the second field region 220 is equal to the length of the first polysilicon gate 130 extending on the first field region 120. In this embodiment, in order to avoid being influenced by the parasitic resistance, the first resistor structure R1 and the second resistor structure R2 should be the same in structure except that the width of the active region and the width of the corresponding N-typed (or P-typed) implanted region.

The contact holes 242 in the second field region 220 and the contact holes 244 in the second field region 220 are used for connection with the metal wirings so as to realize electrical connection of the second resistor structure R2 with other devices. The contact holes 242 and the contact holes 244 may be the same in structure and symmetrically arranged.

In an embodiment, the first resistor structure R1 and the second resistor structure R2 are prepared in synchronization with the semiconductor device, that is, the first active region 110 and the second active region 210 are prepared in synchronization with the active region of the semiconductor device, and the first polysilicon gate 130 and the second polysilicon gate 230 are prepared in synchronization with the polysilicon gate of the semiconductor device.

The first resistor structure R1 and the second resistor structure R2 are designed according to a layout of a predetermined circuit structure and are electrically connected so as to form a test circuit. In the test circuit, a total resistance of a branch in which the first resistor structure R1 is located is equal to a total resistance of a branch in which the second resistor structure R2 is located, so that the current flowing through the first resistor structure R1 and the current flowing through the second resistor structure R2 are the same in the test circuit. Therefore, by monitoring the voltage difference between the first resistor structure R1 and the second resistor structure R2, the variation of the resistance difference between the first resistor structure R1 and the second resistor structure R2 can be obtained. Because in addition to the dimensions of the active region and the corresponding N-typed (or P-typed) implantation region, other factors are the same in the first resistor structure R1 and the second resistor structure R2, the difference between polysilicon resistors is caused by the different widths of the actually prepared polysilicon gates. The different in the widths of the polysilicon gates is caused by the variation in the step heights of the shallow trench isolation structures. Therefore, by monitoring the variation of the voltage difference, it is possible to monitor the influence of the step height of the shallow trench isolation structure on the width of the polysilicon gate on the independent active region, so that the influence of the step height of the shallow trench isolation structure on the width of the polysilicon gate on the active region can be reduced by adjusting the thickness of the photoresist for photoetching the polysilicon. The test structure in this embodiment also has the advantages of simple structure, easy preparation, no increase in production cost, and shortening the production cycle.

In an embodiment, the test structures at different locations on the silicon wafer can be monitored so as to determine whether the uniformity of the measured voltage is good. If the uniformity is poor, it indicates that the width of the polysilicon gate is easily varied. This variation in width is due to the thickness of the photoresist for photoetching the polysilicon gate, and the variation in thickness is due to the variation in the step height of the shallow trench isolation structure. Therefore, it can be explained that the thickness of the currently used photoresist is not suitable according to the test result, so that the thickness of the photoresist for the polysilicon gate of the semiconductor device can be adjusted to an optimal value, so as to reduce the obvious variation of the width of the polysilicon gate due to the variation of the step height of the shallow trench, and the product yield and the product stability are improved. That is, the test structure can also monitor the stability of the lithography process. In another embodiment, in addition to voltage monitoring of test structures at different locations on a same silicon wafer, voltage measurement results of test structures among different silicon wafers can be compared, or voltage test results of test structures among different batches can be compared. In this way, whether the thickness of the photoresist needs to be adjusted can be determined according to the uniformity of the final test voltage, so that the width of the polysilicon gate of the finally obtained semiconductor device is the target feature dimension.

Figure 6:
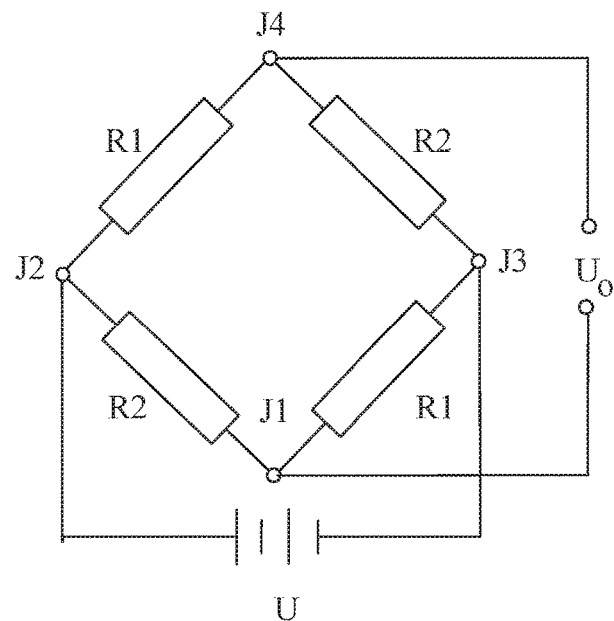
FIG. 6 is a schematic diagram showing a connection between a first resistor structure and a second resistor structure in a test structure for a semiconductor device according to an embodiment.
Figure 7:
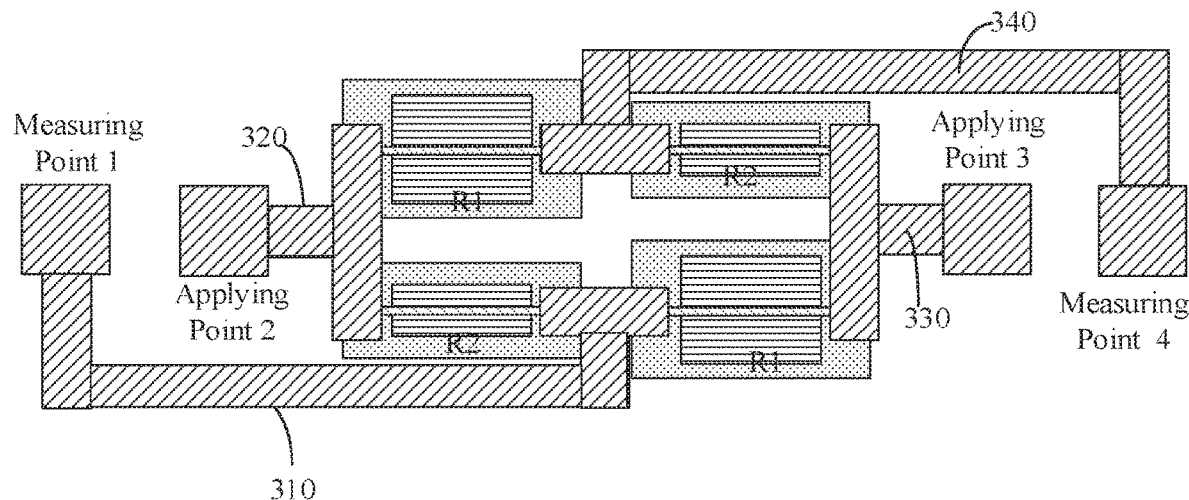
FIG. 7 is a circuit layout of a test structure for a semiconductor device according to an embodiment.

In an embodiment, the first resistor structure R1 and the second resistor structure R2 are electrically connected according to a bridge circuit to form the test circuit. The connection diagram is shown in FIG. 6, and the circuit layout design thereof is shown in FIG. 7. The bridge circuit includes two parallel branches. The first resistor structure R1 and the second resistor structure R2 are disposed in parallel on the two parallel branches. Moreover, orders of the two resistor structures R1 and R2 arranged on the two parallel branches are reversed. Two junctions of the two parallel branches are used as test voltage applying points. As shown in FIG. 7, a junction J2 and a junction J3 are provided. The junction J2 is used as a test voltage applying point 2, and the junction J3 is used as a test voltage applying point. A node between the two resistor structures R1 and R2 of each parallel branch is used as a measuring point. As shown in FIG. 7, a node J1 and a node J4 are provided. The node J1 is used as measuring point 1, and node J4 is used as measuring point 4.

In an embodiment, each of the test voltage applying point and the measuring point is connected to a corresponding contact hole through a metal wiring. Specifically, as shown in FIG. 7, the test structure includes two first resistor structures R1 and two second resistor structures R2. The two first resistor structures R1 includes a first resistor structure R1 on the left side and a first resistor structure R1 on the right side. The two second resistor structures R2 includes a second resistor structure R2 on the left side and a second resistor structure R2 on the right side. The two first resistor structures R1 are respectively provided with two contact holes including a left contact hole and a right contact hole. The two second resistor structures R2 are respectively provided with two contact holes including a left contact hole and a right contact hole. The test voltage applying point 2 is connected to the left contact hole of the first resistor structure R1 on the left side of the figure and the left contact hole of the second resistor structure R2 on the left side of the figure through a metal wiring 320 respectively. The test voltage applying point 3 is connected to the right contact hole of the first resistor R1 on the right side of the figure and the right contact hole of the second resistor structure R2 on the right side of the figure through a metal wiring 330 respectively. The measuring point 1 is connected to the right contact hole of the second resistor structure R2 on the left side of the figure and the left contact hole of the first resistor structure R1 on the right side of the figure through a metal wiring 310 respectively. The measuring point 4 is connected to the right contact hole of the first resistor structure R2 on the left side of the figure and the left contact hole of the second resistor structure R2 on the right side of the figure through a metal wiring 340 respectively.

In this embodiment, in order to reduce the influence of parasitic resistance in the actual circuit, it is necessary to ensure that the connection nodes and the metal wirings of the circuits are the same and are symmetrically arranged. That is, the metal wirings 320 and 330 (the width and length of the metal wirings) are the same in structure and are symmetrically arranged, and the applying point 2 and the applying point 3 are also the same in structure and are symmetrically arranged. The metal wirings 310 and 340 are the same in structure and are symmetrically arranged, and the measuring point 1 and the measuring point 4 are the same in structure and are symmetrically arranged. The metal wirings 310, 320, 330, and 340 may each be an aluminum strip. In an embodiment, each applying or measuring point is led out through a first layer of metal. If the design requirements cannot be met, the applying or measuring point may be led out through a through hole and a second layer of metal.

As shown in FIG. 7, during the test process, a positive electrode of a power supply device may be connected to the applying point 2, and a negative electrode of the power supply device may be connected to the applying point 3, thereby applying a voltage to the test circuit to cause the test circuit to operate. The power supply device may apply a voltage of 0 to 3 V. In other embodiments, the applied voltage of the power supply device may be set as desired. The positive electrode of the voltage measuring device may be connected to the measuring point 1, and the negative electrode of the voltage measuring device may be connected to the measuring point 4 to achieve the monitoring of the voltage difference $U_0$ between the first resistor structure R1 and the second resistor structure R2. The $U_0$ may be represented by:

$$U_0 = [(R1-R2)/(R1+R2)]*U.$$

In the actual PCM measuring process, a 0 to 3V scan voltage may be applied to the test circuit to test a corresponding $U_0$. The slope of the obtained curve is $(R1-R2)/(R1+R2)$.

In these two resistor structures, in addition that the width of the active region and the width of the corresponding N-typed (or P-typed) implantation region are different, other factors are totally the same, the difference between the polysilicon resistors is caused by a different between widths of the polysilicon gates actually prepared, and the difference between the widths of the polysilicon gate is caused by a variation in the step height of the shallow trench isolation structure. When the step height of the shallow trench isolation structure is at a normal value, the difference between the polysilicon resistors of the two structures is at a fixed different value due to the fixed difference in the width of the polysilicon. When the step height of the shallow trench isolation structure fluctuates, this difference also fluctuates. Therefore, through the variation of the difference, the influence of the fluctuation of step height of the shallow trench isolation structure on the width of the polysilicon on the independent small dimension active region can be monitored, and whether the thickness of the photoresist for photoetching the polysilicon is appropriate, i.e. whether the SWING setting of the polysilicon lithography is in an optimal position, can be evaluated.

Figure 8:
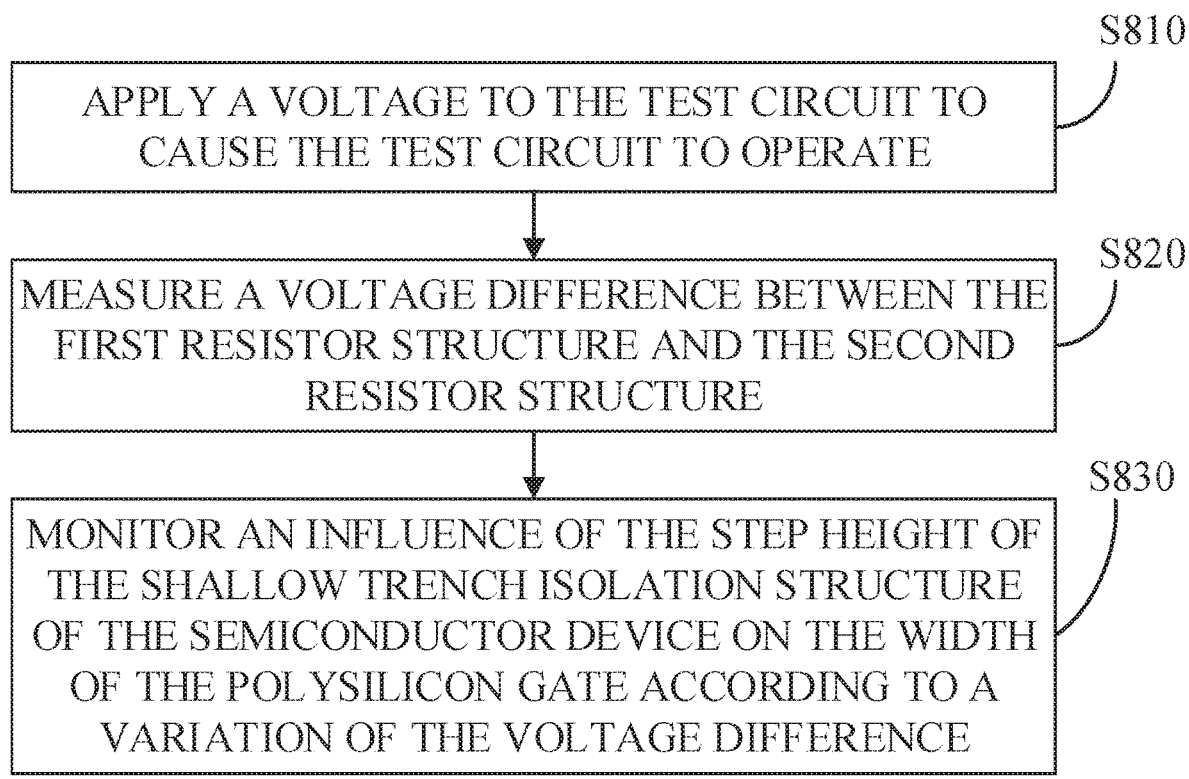
FIG. 8 is a flow chart showing a test method for a semiconductor device according to an embodiment.

A test method for a semiconductor device based on the test structure described in any of the above embodiments is provided FIG. 8 is a flow chart of a test method according to an embodiment, the method including the following steps.

At S810, a voltage is applied to the test circuit to cause the test circuit to operate.

In an embodiment, when the first resistor structure and the second resistor structure are electrically connected to form a test circuit according to the bridge circuit, the step of applying the voltage to the test circuit includes applying voltage to two junctions of the two parallel branches.

At S820, a voltage difference between the first resistor structure and the second resistor structure is measured.

In an embodiment, the first resistor structure and the second resistor structure are electrically connected according to the bridge circuit to form a test circuit (as shown in FIGS. 6 and 7). The step of measuring the voltage difference between the first resistor structure and the second resistor structure includes monitoring a voltage difference between two resistor structures of each of the parallel branches. As shown in FIG. 6, specifically, the voltage difference between the node J1 and the node J4 (i.e., between the measuring point 1 and the measuring point 4 in FIG. 7) may be detected to monitor the voltage difference $U_0$ between the first resistor structure R1 and the second resistor structure R2.

As shown in FIG. 7, during the test process, the positive electrode of a power supply device may be connected to the applying point 2, and the negative electrode of the power supply device may be connected to the applying point 3, thereby applying a voltage to the test circuit to cause the test circuit to operate. The power supply device may apply a voltage of 0 to 3V. In other embodiments, the applied voltage of the power supply device may be set as desired. The positive electrode of the voltage measuring device may be connected to the measuring point 1, and the negative electrode of the voltage measuring device may be connected to the measuring point 4 to achieve the monitoring of the voltage difference $U_0$ between the first resistor structure R1 and the second resistor structure R2. The $U_0$ may be represented by:

$$U_0=[(R1-R2)/(R1+R2)]*U$$

in the actual PCM measuring process, a 0 to 3V scan voltage may be applied to the test circuit to test the corresponding $U_0$. The slope of the obtained curve is (R1−R2)/(R1+R2).

In an embodiment, the voltages across the first resistor structure and the second resistor structure may be measured respectively, and a difference between the voltages across the first resistor structure and the second resistor structure may be calculated to obtain the voltage difference. At S830, the influence of the step height of the shallow trench isolation structure of the semiconductor device on the width of the polysilicon gate is monitored according to a variation of the voltage difference.

It is possible to compare the variations in the voltage differences of different test structures in a same silicon wafer, or to compare the voltage differences of the test structures on different silicon wafers or to compare the voltage differences of different batches of test structures, so as to monitor the influence of the step height of the shallow trench isolation structure on the width of the polysilicon gate.

The influence of the step height of the shallow trench isolation structure on the width of the polysilicon gate on the independent active region can be monitored by the variation in the voltage difference. In this way, the influence degree of the step height of the shallow trench isolation structure on the width of the polysilicon gate on the active region can be reduced by adjusting the thickness of the photoresist for photoetching the polysilicon, so that the width of the polysilicon gate of the finally obtained semiconductor device is the target feature dimension.

All of technical features in the above-described embodiments may be employed in arbitrarily combinations. For the brevity of description, not all possible combinations of the technical features illustrated above are described herein. However, as long as such contradictions of these technical features are not contradictory, they should be considered as within the scope of the disclosure described in this specification.

The above-described embodiments are merely illustrative of several embodiments of the present disclosure, and the description thereof is more specific and detailed, but is not to be construed as limiting the scope of the present disclosure. It should be noted that a number of variations and modifications may be made by those skilled in the art without departing from the spirit and scope of the disclosure. Therefore, the scope of protection of the present disclosure shall be defined by the appended claims.

What is claimed is:

1. A test structure for a semiconductor device, comprising:
a first resistor structure comprising a first active region and a first polysilicon gate disposed on the first active region, wherein a width of the first active region is greater than a predetermined width value, the predetermined width value is a critical value of a width of an active region of the semiconductor device when a step height of a shallow trench isolation structure of the semiconductor device has an influence on a width of a polysilicon gate of the semiconductor device, and a design width of the first polysilicon gate is equal to a design width of the polysilicon gate of the semiconductor device; and
a second resistor structure electrically connected to the first resistor structure in a predetermined circuit structure so as to form a test circuit, wherein the second resistor structure comprises a second active region and a second polysilicon gate disposed on the second active region, a width of the second active region is less than the predetermined width value, a design dimension of the second polysilicon gate is equal to a design dimension of the first polysilicon gate, and a total resistance of a branch in which the second resistor structure is located is equal to a total resistance of a branch in which the first resistor structure is located.

2. The test structure of claim 1, wherein: the predetermined circuit structure is a bridge circuit; the bridge circuit comprises two parallel branches; the first resistor structure and the second resistor structure are arranged on each of the parallel branches in series; orders of two resistor structures arranged on the two parallel branches are reverse to each other; two junctions of the two parallel branches are used as test voltage applying points for applying a voltage to the test circuit; and a node between the two resistor structures of each parallel branch is used as a measuring point for monitoring a voltage difference between the two resistor structures of each parallel branch.

3. The test structure of claim 2, wherein: the two test voltage applying points are the same in structure and are symmetrically arranged; and the two measuring points are the same in structure and are symmetrically arranged.

4. The test structure of claim 2, wherein: the first resistor structure further comprises a first field region surrounding the first active region, and the second resistor structure further comprises a second field region surrounding the second active region; and a length of a portion of the first polysilicon gate extending into the first field region and is equal to a length of a portion of the second polysilicon gate extending into the second field region.

5. The test structure of claim 4, wherein: the first field region and the second field region are both provided with contact holes; and the test voltage applying points and the measuring points are both connected to corresponding contact holes through metal wirings.

6. The test structure of claim 5, wherein: the contact holes of the first field region are located at both ends of the first polysilicon gate in a length direction; and the contact holes of the second field region are located at both ends of the second polysilicon gate in a length direction.

7. The test structure of claim 5, wherein: the metal wirings between the two test voltage applying points and the corresponding contacting holes are the same in structure and are symmetrically arranged; and the metal wirings between the two measuring points and the corresponding contacting holes are the same and are symmetrically arranged.

8. The test structure of claim 1, wherein the predetermined width value is 3 micrometers.

9. The test structure of claim 8, wherein the width of first active region is 20 micrometers and the width of the second active region is 1 micrometer.

10. The test structure of claim 4, wherein: both ends of the first polysilicon gate extend out of the first active region and extend into the first field region, and lengths of portions of the both ends of the first polysilicon gate extending out of the first active region are equal; and both ends of the second polysilicon gate extend out of the second active region and extend into the first field region, and lengths of portions of the both ends of the second polysilicon gate extending out of the second active region are equal.

11. The test structure of claim 1, wherein a length of the first active region is equal to a length of the second active region.

12. The test structure of claim 1 wherein a length of the first active region is 20 micrometers or more, and a length of the second active region is 20 micrometers or more.

13. The test structure of claim 4 wherein a length of the first field region is equal to a length of the second field region.

14. The test structure of claim 1, wherein: the first polysilicon gate is disposed at a middle position of the first active region, and a length direction of the first polysilicon gate is parallel to a length direction of the first active region; and the second polysilicon gate is disposed at a middle position of the second active region, and a length direction of the second polysilicon gate is parallel to a length direction of the second active region.

15. The test structure of claim 1, wherein the first resistor structure and the second resistor structure are both N-typed or P-typed non-self-aligned silicide resistors.

16. The test structure of claim 1, wherein the test structure is disposed in a scribe line region of a silicon wafer.

17. A test method based on a test structure for a semiconductor device, the test structure comprising: a first resistor structure comprising a first active region and a first polysilicon gate disposed on the first active region, wherein a width of the first active region is greater than a predetermined width value, the predetermined width value is a critical value of a width of an active region of the semiconductor device when a step height of a shallow trench isolation structure of the semiconductor device has an influence on a width of a polysilicon gate of the semiconductor device, and a design width of the first polysilicon gate is equal to a design width of the polysilicon gate of the semiconductor device; and a second resistor structure electrically connected to the first resistor structure in a predetermined circuit structure so as to form a test circuit, wherein the second resistor structure comprises a second active region and a second polysilicon gate disposed on the second active region, a width of the second active region is less than the predetermined width value, a design dimension of the second polysilicon gate is equal to a design dimension of the first polysilicon gate, and a total resistance of a branch in which the second resistor structure is located is equal to a total resistance of a branch in which the first resistor structure is located;

the test method comprising:

applying a voltage to the test circuit to cause the test circuit to operate;

measuring a voltage difference between the first resistor structure and the second resistor structure; and monitoring the influence of the step height of the shallow trench isolation structure of the semiconductor device on the width of the polysilicon gate according to a variation of the voltage difference.

18. The test method of claim 17, wherein: the predetermined circuit structure is a bridge circuit; the bridge circuit comprises two parallel branches; the first resistor structure and the second resistor structure are arranged on each of the parallel branches in series; orders of two resistor structures arranged on the two parallel branches are reverse; applying the voltage to the test circuit comprises applying the voltage to two junctions of the two parallel branches; and measuring the voltage difference between the first resistor structure and the second resistor structure comprises monitoring the voltage difference between two resistor structures of each of the parallel branches.

19. The test method of claim 17, wherein the voltage applied to the test circuit ranges from 0 V to 3 V.

* * * * *